United States Patent
Chen et al.

(10) Patent No.: US 10,204,863 B2
(45) Date of Patent: *Feb. 12, 2019

(54) SEMICONDUCTOR PACKAGE STRUCTURE (71) Applicant: Taiwan Semiconductor Manufacturing Co., Ltd., Hsinchu (TW)

(72) Inventors: Jie Chen, New Taipei (TW); Hsien-Wei Chen, Hsinchu (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/004,573

(22) Filed: Jun. 11, 2018

(65) Prior Publication Data
US 2018/0294227 A1   Oct. 11, 2018

Related U.S. Application Data

(63) Continuation of application No. 15/498,254, filed on Apr. 26, 2017, now Pat. No. 9,997,465.

(60) Provisional application No. 62/426,952, filed on Nov. 28, 2016.

(51) Int. Cl.
| | |
|---|---|
| *H01L 23/538* | (2006.01) |
| *H01L 23/31* | (2006.01) |
| *H01L 23/498* | (2006.01) |
| *H01L 23/00* | (2006.01) |

(52) U.S. Cl.
CPC ...... *H01L 23/5386* (2013.01); *H01L 23/3114* (2013.01); *H01L 23/49827* (2013.01); *H01L 23/49894* (2013.01); *H01L 23/5384* (2013.01); *H01L 24/09* (2013.01); *H01L 24/46* (2013.01); *H01L 2224/04042* (2013.01); *H01L 2224/05015* (2013.01); *H01L 2224/08054* (2013.01); *H01L 2224/08056* (2013.01); *H01L 2224/4807* (2013.01); *H01L 2224/4846* (2013.01)

(58) Field of Classification Search
CPC .................... H01L 23/5386; H01L 23/528
See application file for complete search history.

(56) References Cited

U.S. PATENT DOCUMENTS

| | | | |
|---|---|---|---|
| 8,900,929 B2 | 12/2014 | Lin et al. | |
| 9,997,465 B1 * | 6/2018 | Chen | ................... H01L 23/3114 |
| 2015/0294939 A1 | 10/2015 | Yu et al. | |

* cited by examiner

*Primary Examiner* — Mark V Prenty
(74) *Attorney, Agent, or Firm* — McClure, Qualey & Rodack, LLP (57) ABSTRACT

Semiconductor package structures are provided. A semiconductor package structure includes a chip, a molding material surrounding the chip, a through-via extending from a first surface to a second surface of the molding material, and a first re-distribution layer (RDL) wire disposed on the second surface of the molding material and electrically separated from the through-via. The second surface is opposite to the first surface. A portion of the first RDL wire across the through-via has a first segment with a first width and a second segment with a second width different from the first width.

20 Claims, 8 Drawing Sheets

SEMICONDUCTOR PACKAGE STRUCTURE

CROSS REFERENCE TO RELATED APPLICATIONS

This Application is a Continuation of U.S. application Ser. No. 15/498,254, filed on Apr. 26, 2017, now U.S. Pat. No. 9,997,465, which claims priority of U.S. Provisional Application No. 62/426,952, filed on Nov. 28, 2016, the entirety of which is incorporated by reference herein.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node. With the increased demand for miniaturization, higher speed, greater bandwidth, lower power consumption, and lower latency, there has grown a need for smaller and more creative packaging techniques for semiconductor dies.

Three-dimensional (3D) integrated circuits and stacked chips or wafers are used to solve some development limitations of two-dimensional integrated circuits. Typically, a three-dimensional integrated circuit is formed by using through-vias in a semiconductor substrate, to provide the stacked chip/wafer packaging structures, such as using the through-vias to connect the chips or wafers. Therefore, the lengths of the metal wires and the impedances of the wires/traces are decreased and the chip area is also reduced, thereby having the advantages of small size, high integration, high efficiency, low power consumption, and low cost.

Before making a three-dimensional stack, different chips or wafers are separately completed by suitable front-end processes (such as the processes for forming active devices, connecting the metal lines, and so on), and then the through-vias and the re-distributed layers (RDLs) are used to complete the stack steps of the back-end processes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. In some embodiments, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Moreover, spatially relative terms, for example, "lower," "upper," "horizontal," "vertical," "above," "below," "up," "down," "top," "bottom," "left," "right," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1A:
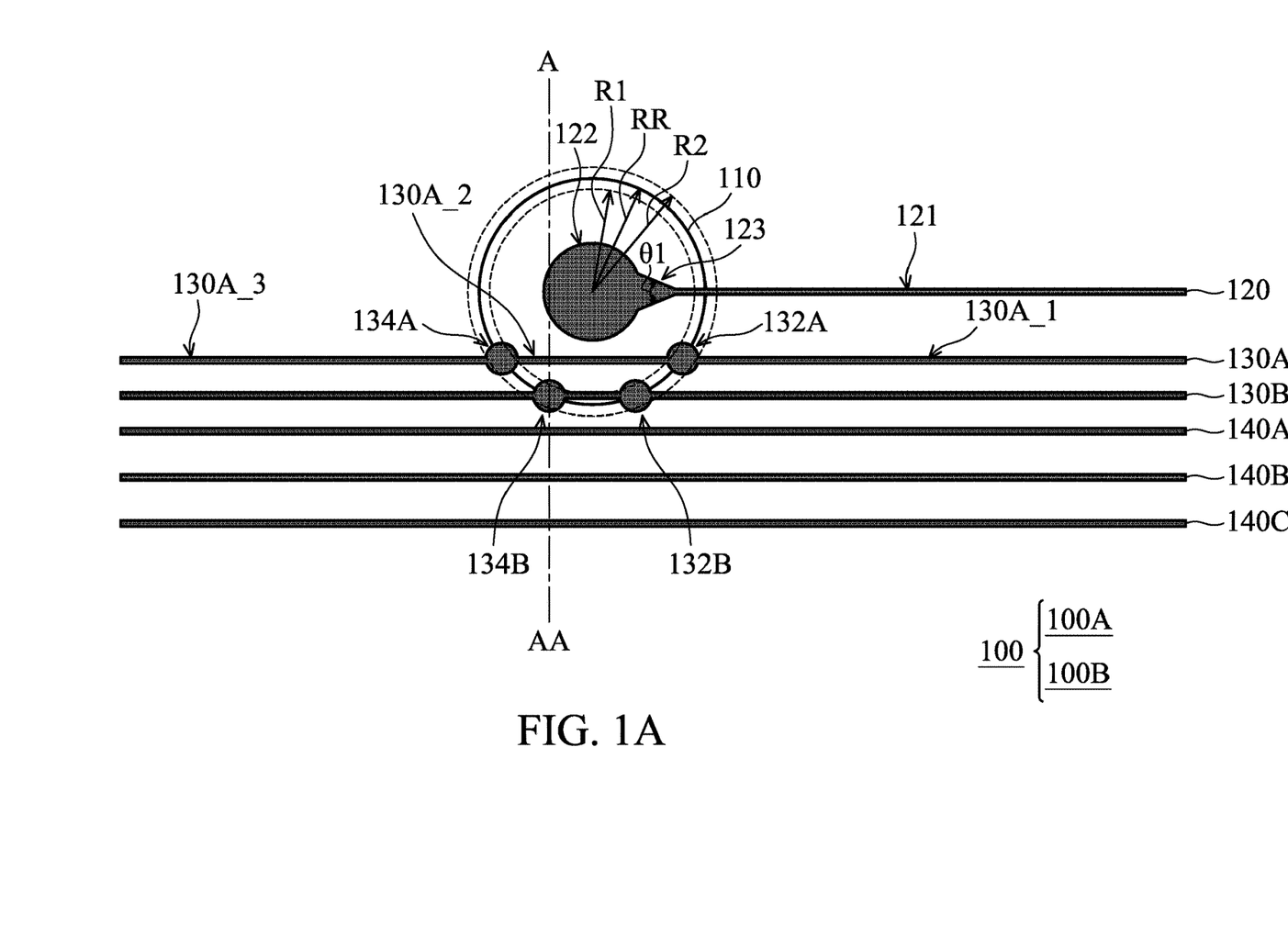
FIG. 1A shows a top view of a re-distribution layer (RDL) configuration in a semiconductor package structure, in accordance with some embodiments of the disclosure.

FIG. 1A shows a top view of a re-distribution layer (RDL) configuration in a semiconductor package structure 100, in accordance with some embodiments of the disclosure. The RDL configuration is formed by a plurality of RDL wires 120, 130A, 130B, 140A, 140B and 140C. Furthermore, the RDL wires 120, 130A, 130B, 140A, 140B and 140C are formed in an RDL level of the semiconductor package structure 100. The RDL level is an interconnect layer containing conductive (e.g. metal or poly-silicon) wires and via connections used to connect the various components in the semiconductor package structure 100.

In some embodiments, the RDL wires 120, 130A, 130B, 140A, 140B and 140C are formed by the same metal material, such as copper, aluminum, tungsten, nickel, the like, or a combination thereof, and may be formed by using electroplating or other acceptable methods. In some embodiments, the elongated portions of the RDL wires 120, 130A, 130B, 140A, 140B and 140C have the same width W (see FIG. 2A). The RDL wires of the RDL configuration provide various signal paths of one or more semiconductor devices available at another location in the semiconductor package structure 100.

In some embodiments, the RDL wire 120 is coupled to a through-via 110, and the through-via 110 is a semiconductor interconnection disposed below the RDL level of the semiconductor package structure 100. In some embodiments, the semiconductor package structure 100 further includes a passivation layer disposed between the RDL level and the through-via 110 of the semiconductor package structure 100, and the RDL wire 120 is connected to the through-via 110 through an opening of the passivation layer. In such embodiments, the passivation layer may be formed by a polymer material.

In some embodiments, the through-via 110 may be a through mold via (TMV), a through package via (TPV), a through interposer via (TIV) or the like, and is formed by a through silicon via (TSV) process for 3D package. As known in the art, the signals and/or powers of various dies and devices in the semiconductor package structure 100 are transmitted through a plurality of through-vias. In order to simplify the description, only one through-via 110 is illustrated in FIG. 1A.

In some embodiments, in addition to an elongated portion 121, the RDL wire 120 further includes a cap portion 122, and a taper (or bird's beak) portion 123 interconnecting the cap portion 122 and the elongated portion 121. The cap portion 122 and the taper portion 123 of the RDL wire 120 are disposed over the through-via 110 as illustrated in FIG. 1A.

In some embodiments, the cap portion 122 of the RDL wire 120 and the through-via 110 have corresponding shapes in a plan view. In such embodiments, the cap portion 122 of the RDL wire 120 and the through-via 110 may be circular in shape. The cap portion 122 may be disposed at a center of through-via 110. In some embodiments, the centers of cap portion 122 and the through-via 110 are overlapping (or concentrically disposed).

In the RDL wire 120, the taper portion 123 is tapered in width from the cap portion 122 to the elongated portion 121, thus avoiding RDL cracking at a junction between the cap portion 122 and the elongated portion 121 for the RDL wire 120 when the elongated portion 121 is directly connected to the cap portion 122. A tapered angle θ1 of taper portion 123 may vary according to the actual application of the signal transmitted by the RDL wire 120.

In order to reduce the layout area and increase the layout flexibility of the RDL level of the semiconductor package structure 100, some RDL wires are arranged across the through-via 110 in certain embodiments.

In some embodiments, the RDL wires 130A, 130B, 140A, 140B and 140C are parallel to the RDL wire 120. Furthermore, the RDL wires 130A, 130B, 140A, 140B and 140C are electrically separated from the through-via 110 and the RDL wire 120.

As illustrated in FIG. 1A, the RDL wires 130A and 130B are the wires partially across the through-via 110. The RDL wires 140A, 140B and 140C are the wires that do not cross the through-via 110. Compared with the RDL wires 140A, 140B and 140C being straight lines, the RDL wires 130A and 130B further include a connecting pattern on an edge of the through-via 110 (e.g., the enclosing boundary of the through-via 110). The connecting pattern provides a larger area on the edge of the through-via 110, so as to avoid RDL cracking in the RDL wires 130A and 130B.

Taking the RDL wire 130A as an example for description, the RDL wire 130A includes a straight line divided into three segments 130A_1, 130A_2 and 130A_3. The segment 130A_2 is arranged between the segments 130A_1 and 130A_3, and the segment 130A_2 is disposed over the through-via 110. Specifically, for the RDL wire 130A, the segment 130A_2 overlaps the through-via 110, and the segments 130A_1 and 130A_3 do not overlap the through-via 110.

In certain embodiments, the connecting pattern may have a circular shape as illustrated in FIG. 1A. Compared with the RDL wires 140A, 140B and 140C, the RDL wire 130A further includes two connecting patterns 132A and 134A. As shown in FIG. 1A, the connecting pattern 132A may be disposed on, e.g., a right side of the through-via 110, and the connecting pattern 134A may be disposed, e.g., on a left side of the through-via 110. Specifically, the connecting pattern 132A physically and electrically interconnects the two segments 130A_1 and 130A_2, and the connecting pattern 134A physically and electrically interconnects the two segments 130A_2 and 130A_3.

In other words, the RDL wire 130A has two intersections at an outer edge of the through-via 110 in a plan view, i.e., a first intersection where the connecting pattern 132A is disposed, and a second intersection where the connecting pattern 134A is disposed. As shown in FIG. 1A, the first intersection of the RDL wire 130A may be located on, e.g., a lower right side of the outer edge of the through-via 110, and the second intersection of the RDL wire 130A may be located on, e.g., a lower left side of the outer edge of the through-via 110. Similarly, the RDL wire 130B has two intersections at the outer edge of the through-via 110 in the same plan view. i.e., a first intersection where the connecting pattern 132B is disposed and a second intersection where the connecting pattern 134B is disposed.

In some embodiments, each circular pattern of the RDL wires 130A and 130B across the through-via 110 can be considered as a pad. For example, the circular pattern 132A is a first pad disposed at the first intersection of the RDL wire 130A, and the circular pattern 134A is a second pad disposed at the second intersection of the RDL wire 130A. Likewise, the circular pattern 132B is a first pad disposed at the first intersection of the RDL wire 130B, and the circular pattern 134B is a second pad disposed at the second intersection of the RDL wire 130B.

In some embodiments, each of the circular patterns 132A and 134A of the RDL wire 130A is centered on the edge of the through-via 110. Similarly, each of the circular patterns 132B and 134B of the RDL wire 130B is centered on the edge of the through-via 110.

In some embodiments, an RDL wire may only have a single intersection at the edge of the through-via 110 in a plan view. That is, such an RDL wire may only include two line segments interconnected by one single connecting pattern which is disposed on the outer edge of the through-via 110. The single connecting pattern of the RDL wire may be centered on the edge of the through-via 110.

In some embodiments, a radius RR of the through-via 110 is greater than a first threshold value R1 and is less than a second threshold value R2, i.e., R1<RR<R2. A difference LA between the first threshold value R1 and the second threshold value R2 defines a space extension from the edge of the through-via 110. The first threshold value R1 and the second threshold value R2 are the minimum distances to avoid RDL cracking for the edge of the through-via 110, and the minimum distance is determined according to the features of the semiconductor package structure 100. The difference LA may be twice as large as the widths W (e.g., 2 W) of the RDL wires 130A and 130B which extend across the through-via 110. In some embodiments, the width W is equal to 10 µm. It may be noted that to prevent the circular pattern of the RDL wire from overlaping the other RDL wires is crucial.

Figure 1B:
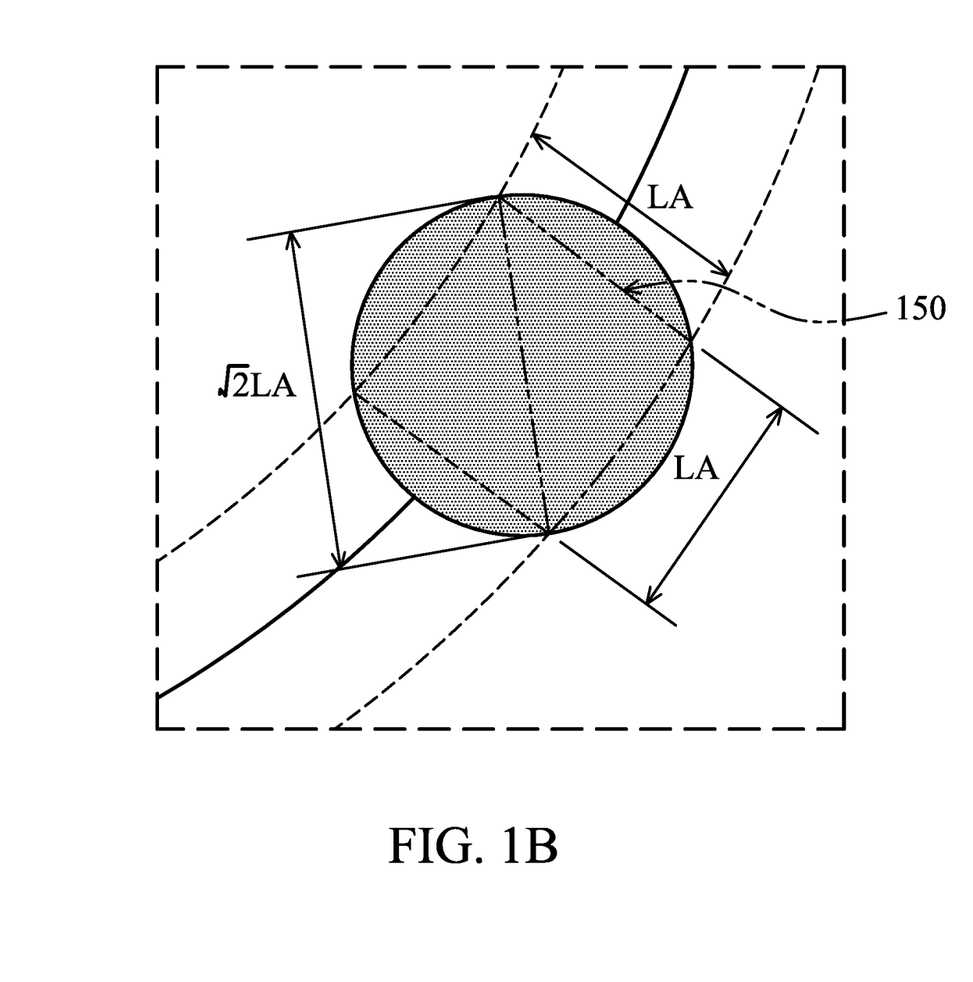
FIG. 1B shows a schematic illustrating the connecting pattern of FIG. 1, in accordance with some embodiments of the disclosure.

In some embodiments, the circular patterns 132A, 134A, 132B and 134B have a same diameter, and the diameter is determined according to the difference LA between the first threshold value R1 and the second threshold value R2. Taking the circular pattern 132A as an example for description, as shown in FIG. 1B, according to an isosceles triangle 150, the diameter of the circular pattern 132A is obtained, e.g., $\sqrt{2}$LA.

Compared with the RDL wires 140A, 140B and 140C that do not extend across the through-via 110, the RDL wires 130A and 130B partially across the through-via 110 have portions (or segments) with various widths. Taking the RDL wire 130A as an example for description, the widths of segments 130A_1 and 130A_3 that do not cross the through-via 110 and away from the edge of the through-via 110 are equal to W. Furthermore, the width of segment 130A_2 across the through-via 110 and away from the edge of the through-via 110 is also equal to W. For the RDL wire 130A, the width over the edge of the through-via 110 is determined according to the connecting patterns 132A and 134A of the RDL wire 130A.

In some embodiments, each connecting pattern of the RDL wires 130A and 130B may have a symmetrical shape, such as a regular polygonal shape, an ellipse shape or an oval shape. It should be noted that regardless of the shape, a minimum diameter of the connecting pattern is greater than the difference LA between the first threshold value R1 and the second threshold value R2.

Figure 2A:
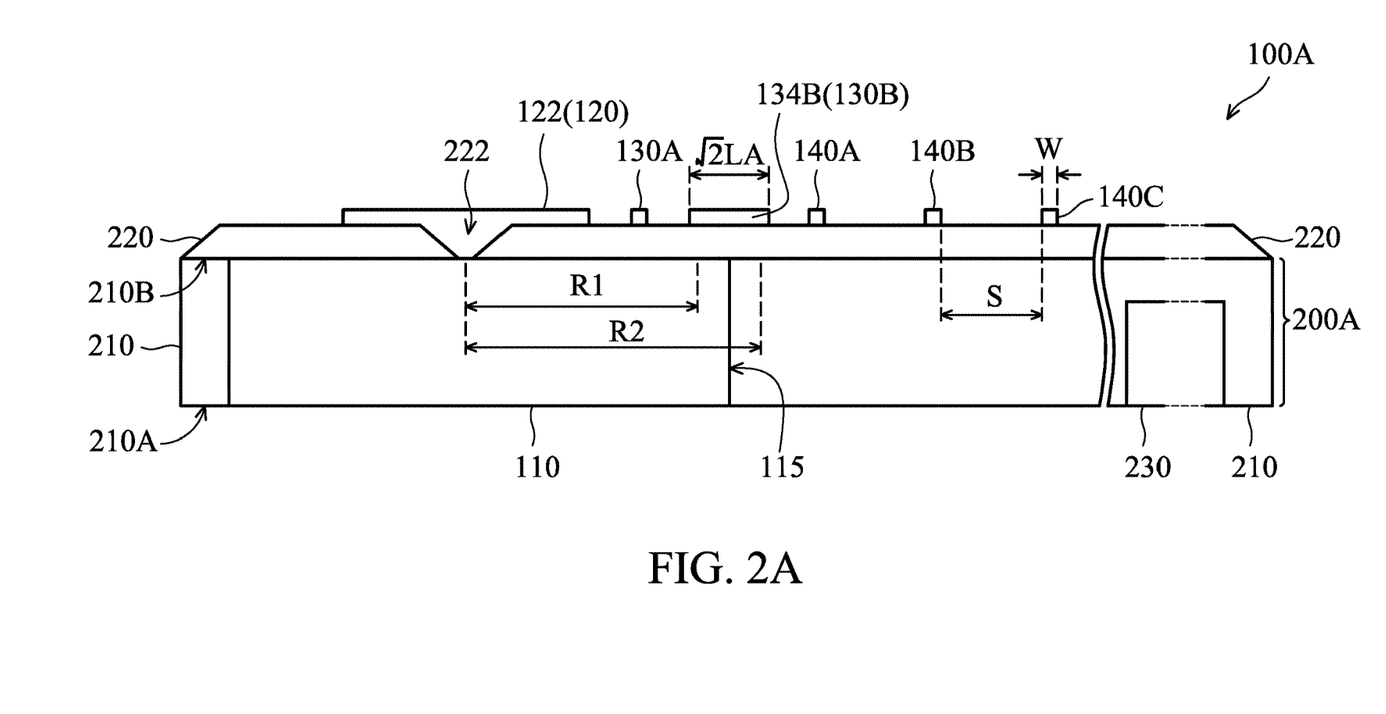
FIG. 2A shows a sectional view of a semiconductor package structure along cutline A-AA of FIG. 1A, in accordance with some embodiments of the disclosure.

FIG. 2A shows a sectional view of a semiconductor package structure 100A along cutline A-AA of FIG. 1A, in accordance with some embodiments of the disclosure. The semiconductor package structure 100A includes a base 200A. In some embodiments, the RDL wires 120, 130A, 130B, 140A, 140B and 140C are arranged in parallel, and the cutline A-AA is perpendicular to the RDL wires RDL wires 120, 130A, 130B, 140A, 140B and 140C.

The base 200A includes a molding material 210 (e.g., a molding compound) and various components (e.g. chips, dies, devices, integrated circuits (ICs) and so on), and at least one chip 230 is surrounded by the molding material 210 in the base 200A.

A passivation layer is disposed on the base 200A, and the passivation layer includes a polymer material 220 disposed on a second surface 210B of the molding material 210. Furthermore, the chip 230 is disposed in the molding material 210 and is close to a first surface 210A of the molding material 210, wherein the second surface 210B is opposite to the first surface 210A.

The through-via 110 is a through mold via (TMV), and extends from the first surface 210A to the second surface 210B of the molding material 210. Specifically, the through-via 110 passes through the molding material 210. Furthermore, the RDL wires 120, 130A, 130B, 140A, 140B and 140C are formed in an RDL level on the polymer material 220, and the through-via 110 is coupled to the cap portion 122 of the RDL wire 120 via an opening 222 of the polymer material 220.

In some embodiments, the base 200A is an interposer, and the through-via 110 is a through interposer via (TIV).

The RDL wires 120, 130A, 130B, 140A, 140B and 140C are disposed in parallel in the RDL level of the semiconductor package structure 100A. The space between adjacent two of the RDL wires 130A, 130B, 140A, 140B and 140C is set to S, and the space S is determined according to the signals transmitted in the RDL wires. In some embodiments, the diameter of the circular pattern 134B is determined according to the space S between the RDL wires 130A and 130B and the space S between the RDL wires 130B and 140A. Furthermore, the RDL wires 120, 130A, 130B, 140A, 140B and 140C are electrically separated from each other. The RDL wires 120, 130A and 130B are disposed over the through-via 110. The cap portion 122 of the RDL wire 120 is arranged in the middle of through-via 110. The RDL wire 130A is disposed between the cap portion 122 of the RDL wire 120 and the circular pattern 134B of the RDL wire 130B.

The circular pattern 134B of the RDL wire 130B is disposed on the edge 115 of the through-via 110 (e.g. a boundary between the through-via 110 and the molding material 210). For the RDL wire 130B, a portion of the circular pattern 134B is disposed on the through-via 110 and the polymer material 220, and the remaining portion of the circular pattern 134B is disposed on the molding material 210 and the polymer material 220. In some embodiments, the middle of circular pattern 134B of the RDL wire 130B is aligned to the edge 115 of the through-via 110.

In FIG. 2A, the widths of the RDL lines 130A, 140A, 140B and 140C are the same (e.g., equal to W). In some embodiments, the width of the circular pattern 134B of the RDL wire 130B is equal to the diameter of the circular pattern 134B, e.g. $\sqrt{2}$LA. As described above, the diameter of the circular pattern 134B is determined according to the difference LA between the first threshold value R1 and the second threshold value R2. In some embodiments, the difference LA between the first threshold value R1 and the second threshold value R2 is equal to or greater than twice as big as the widths W of the RDL lines 130A, 140A, 140B and 140C, e.g. LA≥2 W. Thus, the diameter of the circular pattern 134B is greater than the difference LA between the first threshold value R1 and the second threshold value R2.

Figure 2B:
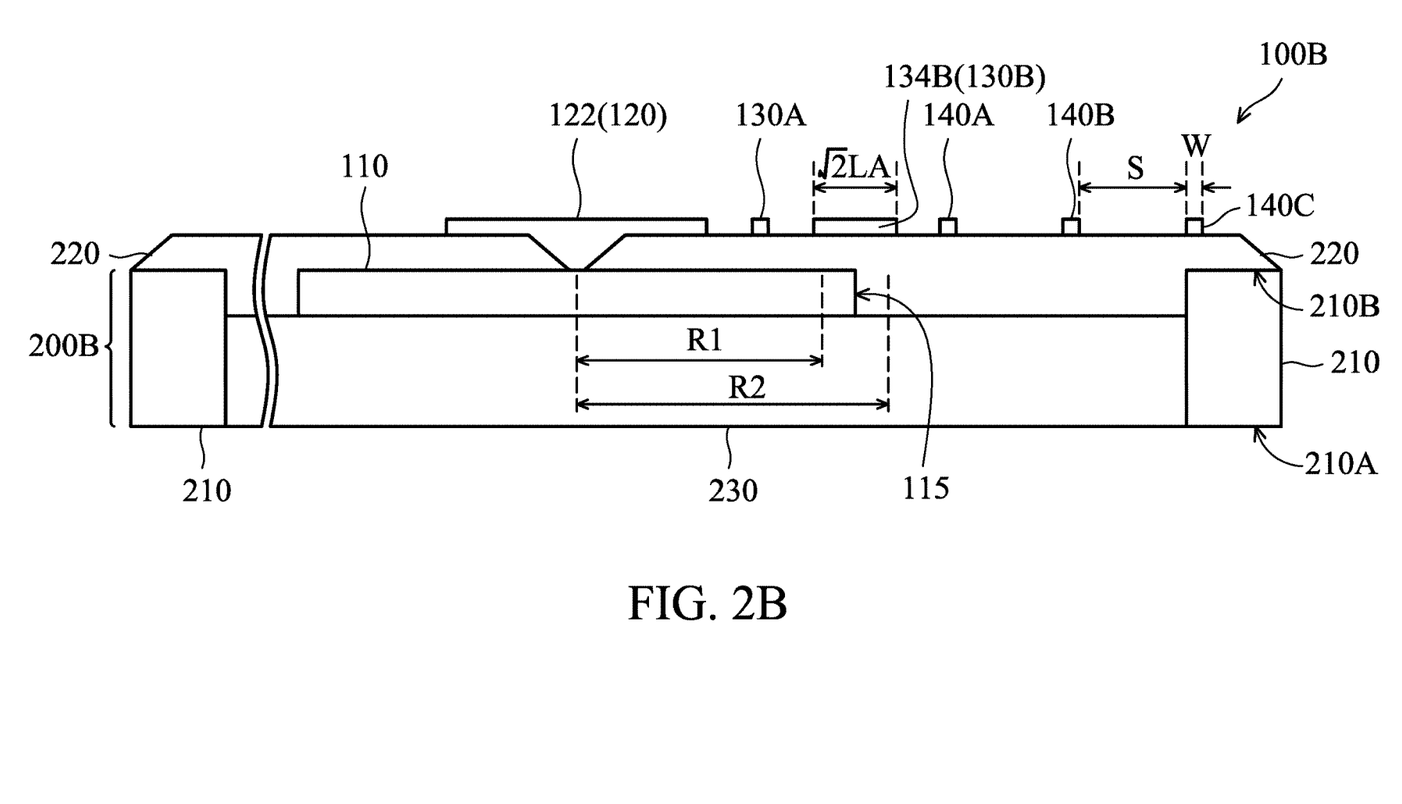
FIG. 2B shows another sectional view of a semiconductor package structure along cutline A-AA of FIG. 1A, in accordance with some embodiments of the disclosure.

FIG. 2B shows another sectional view of a semiconductor package structure 100B along cutline A-AA of FIG. 1A, in accordance with some embodiments of the disclosure. The semiconductor package structure 100B includes a base 200B. In some embodiments, the RDL wires 120, 130A, 130B, 140A, 140B and 140C are arranged in parallel, and the cutline A-AA is perpendicular to the RDL wires RDL wires 120, 130A, 130B, 140A, 140B and 140C.

The base 200B includes a molding material 210 (e.g. a molding compound) and various components (e.g. chips, dies, devices, integrated circuits (ICs) and so on), and at least one chip 230 is surrounded by the molding material 210 in the base 200B.

A passivation layer is disposed on the base 200B, and the passivation layer includes a polymer material 220 disposed on a second surface 210B of the molding material 210. Furthermore, the chip 230 is disposed on a first surface 210A of the molding material 210, wherein the second surface 210B is opposite to the first surface 210A.

In such embodiments, the through-via 110 extends from the chip 230 to the second surface 210B of the molding material 210. Furthermore, the through-via 110 is electrically coupled to a pad (not shown) of the chip 230, so as to transmit a signal of power between the chip 230 and the RDL wire 120.

In some embodiments, the through-via 110 is surrounded by the polymer material 220 in the base 200B, and the through-via 110 is coupled to the cap portion 122 of the RDL wire 120 via an opening 222 of the polymer material 220.

The RDL wires 120, 130A, 130B, 140A, 140B and 140C are formed in an RDL level on the polymer material 220. Furthermore, the RDL wires 120, 130A, 130B, 140A, 140B and 140C are disposed in parallel in the RDL level of the semiconductor package structure 100B. The space between two adjacent wires of the RDL wires 130A, 130B, 140A, 140B and 140C is set to S. Furthermore, the RDL wires 120, 130A, 130B, 140A, 140B and 140C are electrically separated from each other. The RDL wires 120, 130A and 130B are disposed over the through-via 110. The cap portion 122 of the RDL wire 120 is arranged in the middle of through-via 110. The RDL wire 130A is disposed between the cap portion 122 of the RDL wire 120 and the circular pattern 134B of the RDL wire 130B.

The circular pattern 134B of the RDL wire 130B is disposed on the edge 115 of the through-via 110. For the RDL wire 130B, a portion of the circular pattern 134B is disposed on the through-via 110 and the polymer material 220, and the remaining portion of the circular pattern 134B is disposed on the polymer material 220. In some embodiments, the middle of circular pattern 134B of the RDL wire 130B is aligned to the edge 115 of the through-via 110.

In FIG. 2B, the widths of the RDL lines 130A, 140A, 140B and 140C are the same (e.g. equal to W). In some embodiments, the width of the circular pattern 134B of the RDL wire 130B is equal to the diameter of the circular pattern 134B, e.g. $\sqrt{2}$LA. As described above, the diameter of the circular pattern 134B is determined according to the difference LA between the first threshold value R1 and the second threshold value R2. In some embodiments, the difference LA between the first threshold value R1 and the second threshold value R2 is equal to or greater than twice as big as the widths W of the RDL lines 130A, 140A, 140B and 140C, e.g. LA≥2 W. Thus, the diameter of the circular pattern 134B is greater than twice the width W of the RDL line 130B, so as to avoid RDL cracking in the RDL wire 130B.

Figure 3A:
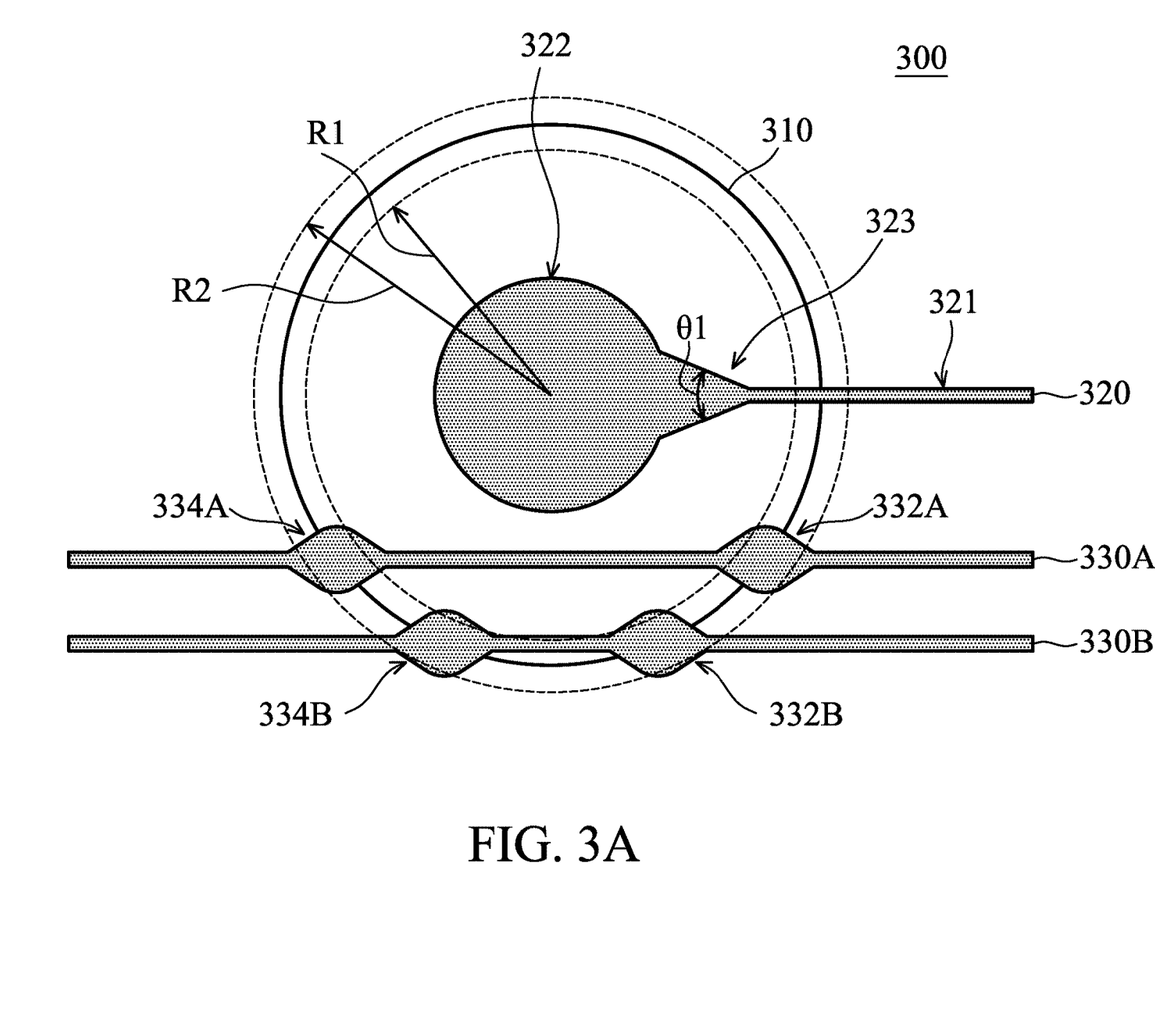
FIG. 3A shows a top view of an RDL configuration in a semiconductor package structure, in accordance with some embodiments of the disclosure.

FIG. 3A shows a top view of an RDL configuration in a semiconductor package structure 300, in accordance with some embodiments of the disclosure. The RDL configuration is formed by a plurality of RDL wires 320, 330A and 330B. Furthermore, the RDL wires 320, 330A and 330B are formed in an RDL level of the semiconductor package structure 300. The RDL level is an interconnect layer containing conductive (e.g. metal or poly-silicon) wires and via connections used to connect the various components in the semiconductor package structure 300. In order to simplify the description, the RDL wires (e.g. 140A-140C of FIG. 1A) that do not cross a through-via 310 are omitted.

In some embodiments, the RDL wires 320, 330A and 330B are formed by the same metal material, such as copper, aluminum, tungsten, nickel, the like, or a combination thereof, and may be formed using electroplating or another acceptable method. In some embodiments, the elongated portions of the RDL wires 320, 330A and 330B have the same width W. The RDL wires of the RDL configuration provide various signal paths of one or more semiconductor devices available at another location in the semiconductor package structure 300.

In some embodiments, the RDL wire 320 is coupled to the through-via 310, and the through-via 310 is a semiconductor interconnection disposed below the RDL level of the semiconductor package structure 300. In some embodiments, the semiconductor package structure 300 further includes a passivation layer disposed between the RDL level and the through-via 310 of the semiconductor package structure 300, and the RDL wire 320 is connected to the through-via 310 through an opening of the passivation layer. In such embodiments, the passivation layer may be formed by a polymer material.

In some embodiments, the through-via 310 may be a through mold via (TMV), a through package via (TPV), a through interposer via (TIV) or the like, and is formed by a through silicon via (TSV) process for 3D package. As known in the art, the signals and/or powers of various dies and devices in the semiconductor package structure 300 are transmitted through a plurality of through-vias. In order to simplify the description, only one through-via 310 is illustrated in FIG. 3A.

As described above, the RDL wire 320 includes an elongated portion 321, a cap portion 322 and a taper portion 323. Furthermore, an angle θ1 of taper portion 323 is determined according to the actual application of the signal transmitted by the RDL wire 320.

In some embodiments, the through-via 310 is surrounded by the molding material, and the through-via 310 is coupled to the cap portion 322 of the RDL wire 320 via an opening of the polymer material, such as the through-via 110 of FIG. 2A.

In some embodiments, the through-via 310 is surrounded by the polymer material, and the through-via 310 is coupled to the cap portion 322 of the RDL wire 320 via an opening of the polymer material, such as the through-via 110 of FIG. 2B.

In some embodiments, the RDL wires 330A and 330B are parallel to the RDL wire 320. Furthermore, the RDL wires 330A and 330B are electrically separated from the through-via 310 and the RDL wire 320.

The RDL wires 330A and 330B are the wires partially across the through-via 310. As described above, the RDL wires 330A and 330B further include a connecting pattern on an edge of the through-via 310, so as to avoid RDL cracking in the RDL wires 330A and 330B. The RDL wire 330A has a first intersection where a connecting pattern 332A is disposed and a second intersection where a connecting pattern 334A is disposed at the edge of the through-via 310 in a plan view. Similarly, the RDL wire 330B has a first intersection where a connecting pattern 332B is disposed and a second intersection where a connecting pattern 334B is disposed at the edge of the through-via 310 in the same plan view.

Compared with the circular patterns 132A, 134A, 132B and 134B of FIG. 1A, the connecting patterns 332A and 334A of the RDL wire 330A and the connecting patterns 332B and 334B of the RDL wire 330B include a main portion and two taper portions.

Figure 3B:
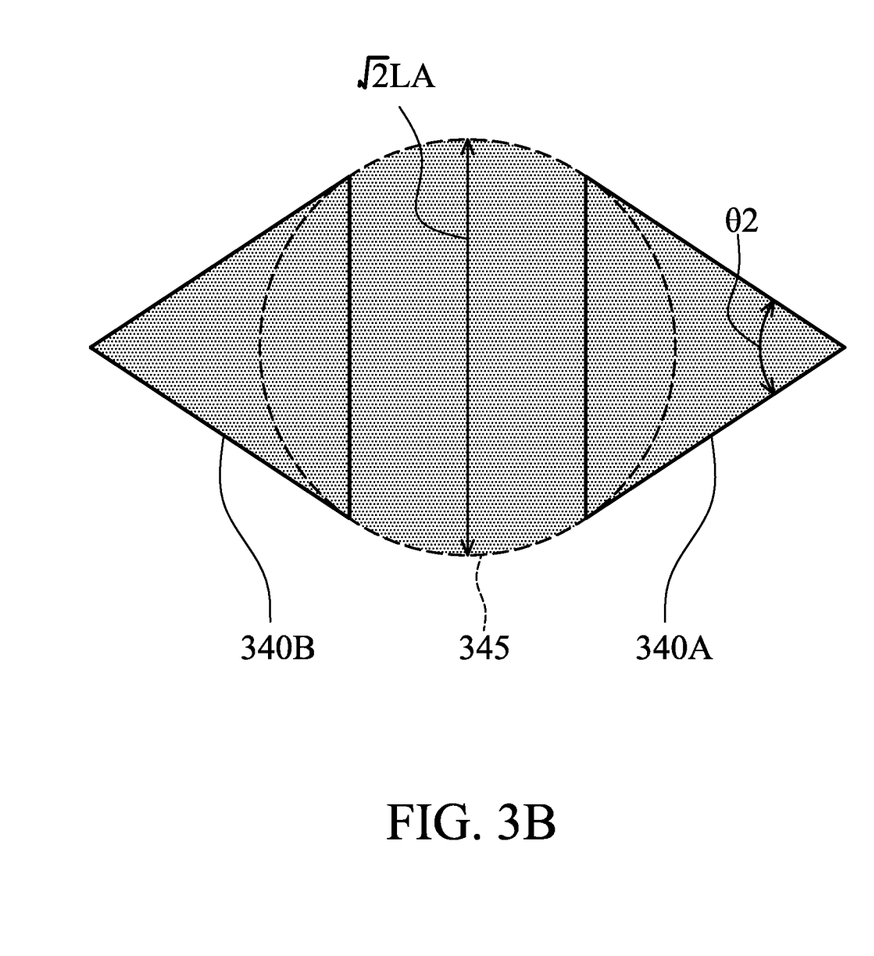
FIG. 3B shows a schematic illustrating the connecting pattern of FIG. 3A, in accordance with some embodiments of the disclosure.

FIG. 3B shows a schematic illustrating the connecting pattern of FIG. 3A, in accordance with some embodiments of the disclosure. Referring to FIG. 3A and FIG. 3B together, taking the connecting pattern 332B of the RDL wire 330B as an example for description, the connecting pattern 332B includes a main portion 345 and two taper portions 340A and 340B. In such embodiments, the main portion 345 has a circular shape, and a diameter of the main portion 345 is determined according to the difference LA between the first threshold value R1 and the second threshold value R2. As described above, the diameter of the main portion 345 is greater than or equal to $\sqrt{2}LA$. In some embodiments, a diameter of the connecting pattern 332B is determined according to the diameter of the main portion 345.

In some embodiments, the main portion 345 has a symmetrical shape, such as a regular polygonal shape, an ellipse shape or an oval shape.

For the connecting pattern 332B of the RDL wire 330B, the taper portion 340A is disposed on a side (e.g. the right side) of the main portion 345, and the taper portion 340B is disposed on an opposite side (e.g. the left side) of the main portion 345. Furthermore, an angle θ2 of taper portions 340A and 340B is determined according to the actual application of the signal transmitted by the RDL wire 330B. In some embodiments, the angles θ2 of the taper portions 340A and 340B are greater than or equal to 30 degrees (e.g. θ2≥30°).

Figure 4A:
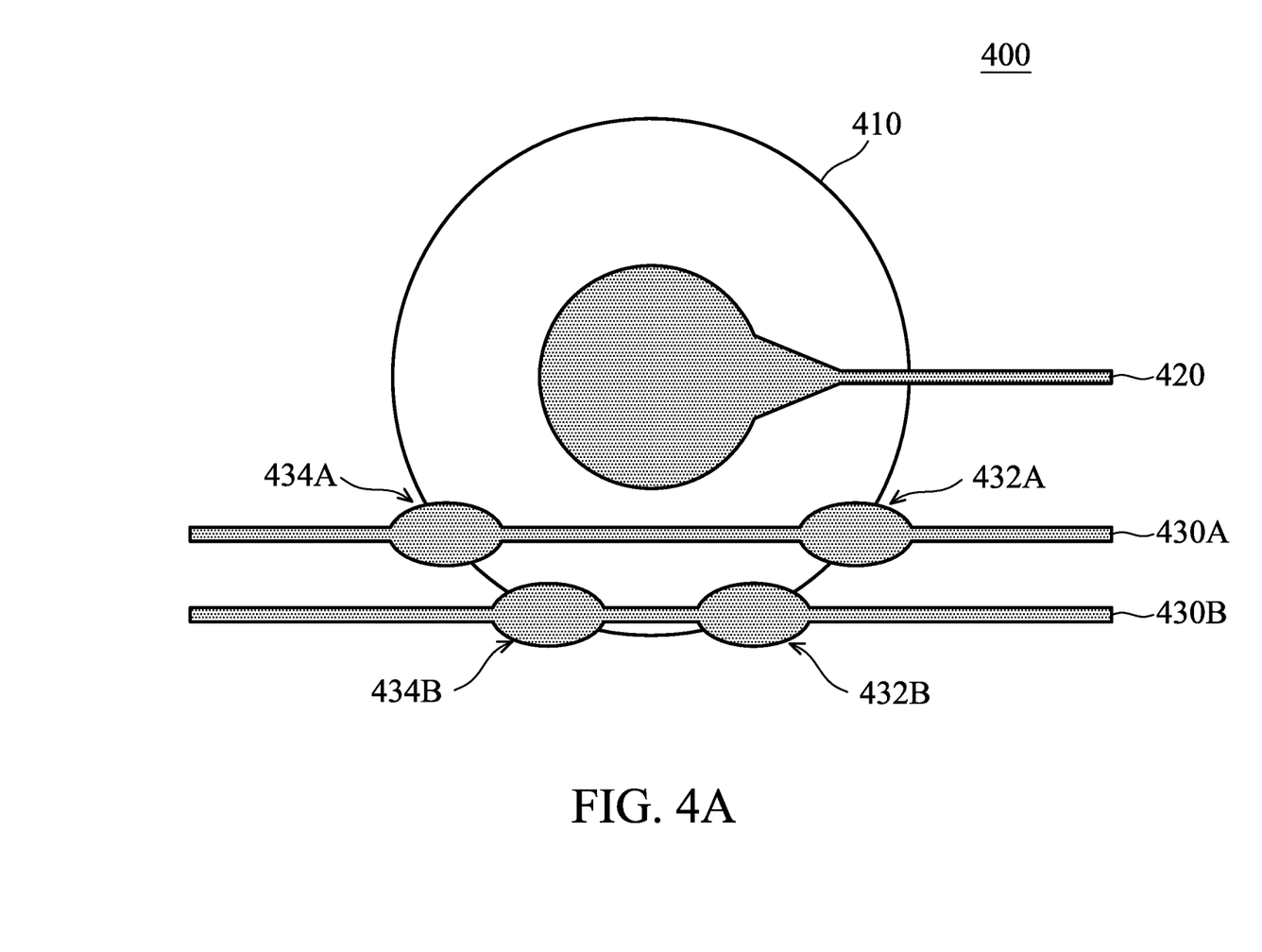
FIG. 4A shows a top view of an RDL configuration in a semiconductor package structure, in accordance with some embodiments of the disclosure.

FIG. 4A shows a top view of an RDL configuration in a semiconductor package structure 400, in accordance with some embodiments of the disclosure. The RDL configuration is formed by a plurality of RDL wires 420, 430A and 430B. Furthermore, the RDL wires 420, 430A and 430B are formed in an RDL level of the semiconductor package structure 400. The RDL level is an interconnect layer containing conductive (e.g. metal or poly-silicon) wires and via connections used to connect the various components in the semiconductor package structure 400. In order to simplify the description, the RDL wires (e.g. 140A-140C of FIG. 1A) that do not cross the through-via 410 are omitted.

In some embodiments, the through-via 410 is surrounded by the molding material, and the through-via 410 is coupled to the RDL wire 420 via an opening of the polymer material, such as the through-via 110 of FIG. 2A.

In some embodiments, the through-via 410 is surrounded by the polymer material, and the through-via 410 is coupled to the RDL wire 420 via an opening of the polymer material, such as the through-via 110 of FIG. 2B.

In some embodiments, the RDL wires 430A and 430B are parallel to the RDL wire 420. Furthermore, the RDL wires 430A and 430B are electrically separated from the through-via 410 and the RDL wire 420.

In some embodiments, the RDL wires 430A and 430B are the wires partially across the through-via 410. As described above, the RDL wires 430A and 430B further include a connecting pattern on an edge of the through-via 410, so as to avoid RDL cracking in the RDL wires 430A and 430B. The RDL wire 430A has a first intersection where a connecting pattern 432A is disposed and a second intersection where a connecting pattern 434A is disposed at the edge of the through-via 410 in a plan view. Similarly, the RDL wire 430B has a first intersection where a connecting pattern 432B is disposed and a second intersection where a connecting pattern 434B is disposed at the edge of the through-via 410 in the same plan view.

Figure 4B:
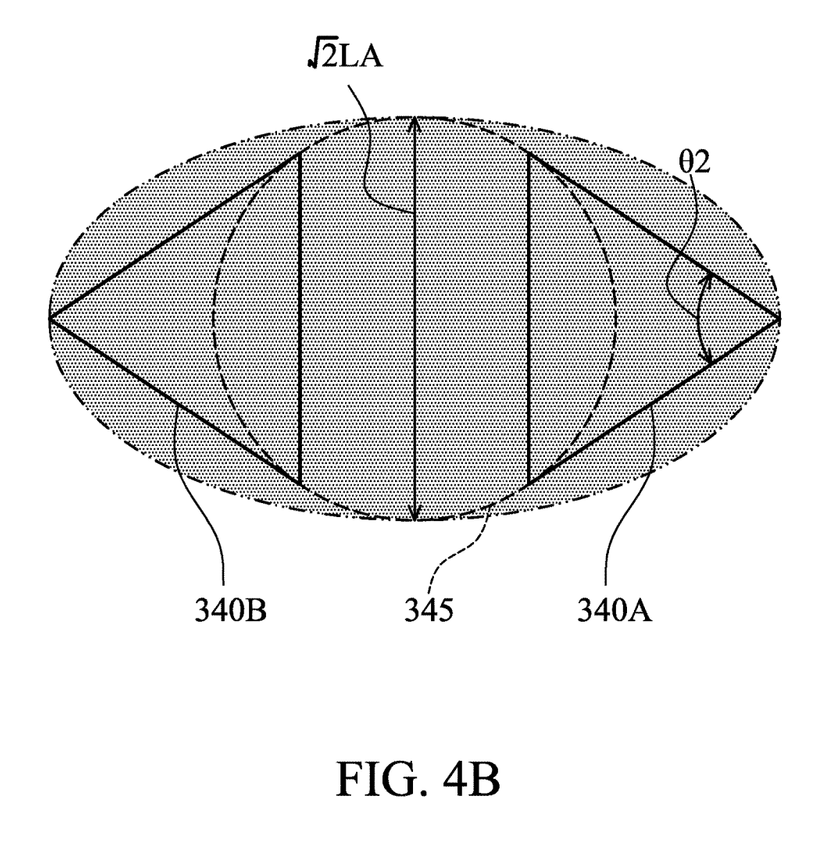
FIG. 4B shows a schematic illustrating the connecting pattern of FIG. 4A, in accordance with some embodiments of the disclosure.

FIG. 4B shows a schematic illustrating the connecting pattern of FIG. 4A, in accordance with some embodiments of the disclosure. Referring to FIG. 4A and FIG. 4B together, the connecting patterns 432A, 434A, 432B and 434B have an ellipse shape In the semiconductor package structure 400. In some embodiments, each area of the ellipse patterns 432A, 434A, 432B and 434B is large enough to cover the connecting patterns of FIG. 3A, i.e. the main portion 345 and two taper portions 340A and 340B of the connecting patterns 332B, 332A, 334A and 334B.

In general, ellipses have two perpendicular axes about which the ellipse is symmetric. Due to this symmetry, these axes intersect at the center of the ellipse. The larger of these two axes, which corresponds to the larger distance between antipodal points on the ellipse, is called the major axis. The smaller of these two axes, and the smaller distance between antipodal points on the ellipse, is called the minor axis.

In such embodiments, the minor axis of the ellipse patterns 432B is determined according to the diameter of the main portion 345 of the connecting pattern 332B. Thus, the minor axis of the ellipse patterns 432B is equal to $\sqrt{2}LA$, as described above. Furthermore, the major axis of the ellipse patterns 432B is greater than $\sqrt{2}LA$.

Embodiments for semiconductor package structures are provided. In the semiconductor package structure, some RDL wires are partially across a through-via. The through-via is surrounded by a molding material or a polymer material in the semiconductor package structure. Each RDL wire across the through-via has at least one connecting pattern on the edge of the through-vias. The connecting pattern has a symmetrical shape, such as a circular shape, a regular polygonal shape, an ellipse shape or an oval shape. In some embodiments, the connecting pattern includes a main portion having a symmetrical shape, and two taper portions disposed on two opposite sides of the main portion. The connecting pattern provides a larger area on the edge of the through-via, so as to avoid RDL cracking in the RDL wire across the through-via.

In some embodiments, a semiconductor package structure is provided. The semiconductor package structure includes a chip, a molding material surrounding the chip, a through-via extending from a first surface to a second surface of the molding material, and a first re-distribution layer (RDL) wire disposed on the second surface of the molding material and electrically separated from the through-via. The second surface is opposite to the first surface. A portion of the first RDL wire across the through-via has a first segment with a first width and a second segment with a second width different from the first width.

In some embodiments, a semiconductor package structure is provided. The semiconductor package structure includes a base, a through-via in the base, and a re-distribution layer (RDL) level on the base. The RDL level includes an RDL wire across the through-via. The RDL wire includes a pad disposed on intersection at an edge of the through-via in a plan view. A diameter of the pad is greater than a width of the RDL wire.

In some embodiments, a semiconductor package structure is provided. The semiconductor package structure includes a chip, a molding material surrounding the chip, a polymer material disposed on the molding material and chip, a through-via on the chip and surrounded by the polymer material, and a first re-distribution layer (RDL) wire disposed on the polymer material and electrically separated from the through-via. A portion of the first RDL wire across the through-via has a first segment with a first width and a second segment with a second width different from the first width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure, comprising:
   a chip;
   a molding material surrounding the chip;
   a through-via extending from a first surface to a second surface of the molding material, wherein the second surface is opposite to the first surface; and
   a first re-distribution layer (RDL) wire disposed on the second surface of the molding material and electrically separated from the through-via,
   wherein a portion of the first RDL wire across the through-via has a first segment with a first width and a second segment with a second width different from the first width.

2. The semiconductor package structure as claimed in claim 1, wherein the first width of the first segment of the first RDL wire on a boundary between the through-via and the molding material is greater than the second width of the second segment of the first RDL wire on the through-via.

3. The semiconductor package structure as claimed in claim 1, wherein the first RDL wire has a connecting pattern on a boundary between the through-via and the molding material, and a center of the connecting pattern is centered on an edge of the through-via.

4. The semiconductor package structure as claimed in claim 3, wherein the connecting pattern comprises a main portion having a circular shape, a regular polygonal shape, an ellipse shape or an oval shape.

5. The semiconductor package structure as claimed in claim 4, wherein the connecting pattern further comprises a first taper portion disposed on a side of the main portion and a second taper portion disposed on an opposite side of the main portion.

6. The semiconductor package structure as claimed in claim 5, wherein angles of the first and second taper portions are greater than or equal to 30 degrees.

7. The semiconductor package structure as claimed in claim 1, further comprising:
   a second RDL wire disposed on the second surface of the molding material and parallel to the first RDL wire; and
   a polymer material disposed on the molding material and between the first and second RDL wires and the molding material,
   wherein the second RDL wire is connected to the through-via through an opening of the polymer material.

8. A semiconductor package structure, comprising:
   a base;
   a through-via in the base; and
   a re-distribution layer (RDL) level on the base, and comprising:
   an RDL wire across the through-via, comprising a pad disposed on an intersection at an edge of the through-via in a plan view,
   wherein a diameter of the pad is greater than a width of the RDL wire.

9. The semiconductor package structure as claimed in claim 8, wherein the RDL wire is electrically separated from the through-via.

10. The semiconductor package structure as claimed in claim 8, wherein the pad has a connecting pattern, and a center of the connecting pattern is centered on an edge of the through-via.

11. The semiconductor package structure as claimed in claim 10, wherein the connecting pattern comprises a main portion having a circular shape, a regular polygonal shape, an ellipse shape or an oval shape, and the diameter of the pad is determined according to the main portion of the connecting pattern.

12. The semiconductor package structure as claimed in claim 11, wherein the connecting pattern further comprises a first taper portion disposed on a side of the main portion and a second taper portion disposed on an opposite side of the main portion.

13. The semiconductor package structure as claimed in claim 8, wherein the base further comprises:
   a chip;
   a molding material surrounding the chip; and
   a polymer material disposed on the molding material,
   wherein the RDL wire is connected to the through-via through an opening of the polymer material.

14. The semiconductor package structure as claimed in claim 8, wherein the base comprises an interposer.

15. A semiconductor package structure, comprising:
   a chip;
   a molding material surrounding the chip;
   a polymer material disposed on the molding material and chip;
   a through-via on the chip and surrounded by the polymer material; and
   a first re-distribution layer (RDL) wire disposed on the polymer material and electrically separated from the through-via,
   wherein a portion of the first RDL wire across the through-via has a first segment with a first width and a second segment with a second width different from the first width.

16. The semiconductor package structure as claimed in claim 15, wherein the first width of the first segment of the first RDL wire on a boundary between the through-via and the polymer material is greater than the second width of the second segment of the first RDL wire on the through-via.

17. The semiconductor package structure as claimed in claim 15, wherein the first RDL wire has a connecting pattern on a boundary between the through-via and the polymer material, and a center of the connecting pattern is centered on an edge of the through-via.

18. The semiconductor package structure as claimed in claim 17, wherein the connecting pattern comprises a main portion having a circular shape, a regular polygonal shape, an ellipse shape or an oval shape.

19. The semiconductor package structure as claimed in claim 18, wherein the connecting pattern further comprises a first taper portion disposed on a side of the main portion and a second taper portion disposed on an opposite side of the main portion.

20. The semiconductor package structure as claimed in claim 15, further comprising:
   a second RDL wire disposed on the polymer material and parallel to the first RDL wire,
   wherein the second RDL wire is coupled to the chip through the through-via and an opening of the polymer material.

* * * * *